United States Patent
Oh

(10) Patent No.: US 7,065,698 B2
(45) Date of Patent: Jun. 20, 2006

(54) METHOD AND APPARATUS FOR ENCODING/DECODING REED-SOLOMON CODE IN BIT LEVEL

(75) Inventor: Min Seok Oh, Seongnam (KR)

(73) Assignee: LG Electronics Inc., Seoul (KR)

( * ) Notice: Subject to any disclaimer, the term of this patent is extended or adjusted under 35 U.S.C. 154(b) by 545 days.

(21) Appl. No.: 09/942,939

(22) Filed: Aug. 31, 2001

(65) Prior Publication Data

US 2002/0152443 A1    Oct. 17, 2002

(30) Foreign Application Priority Data

Mar. 3, 2001 (KR) ................ 2001-11026

(51) Int. Cl.
*H03M 13/00* (2006.01)

(52) U.S. Cl. ................... 714/784; 714/756

(58) Field of Classification Search ............... 714/784, 714/778, 755–756, 762, 795–796; 375/265, 375/298, 341; 341/50; 326/59–60; 370/479
See application file for complete search history.

(56) References Cited

U.S. PATENT DOCUMENTS 5,784,298 A * 7/1998 Hershey et al. ............... 714/39
6,115,436 A * 9/2000 Ramesh et al. ............. 375/341
6,272,661 B1 * 8/2001 Yamaguchi ................. 714/795
6,373,859 B1 * 4/2002 Jedwab et al. ............. 370/479

OTHER PUBLICATIONS

Ran et al "Soft decoding techniques for broadband wireless channels" IEEE, pp. 1595-1598, Aug. 2000.*
Wolf "On codes derivable from the tensor product of check matrices;"IEEE Transactions on Information Theory, Publication Date: Apr. 1965 vol.: 11, Issue: 2 ;On pp.: 281-284.*
Davydov 'Constructions and families of covering codes and saturated sets of points in projective geometry;', IEEE Transactions on Publication Date: Nov. 1995, vol.: 41 , Issue: 6, Part 2;On pp.: 2071-2080.*
"2nd International Symposium on Turbo Codes & Related Topics", Brest, France 2000.

* cited by examiner

*Primary Examiner*—Guy J. Lamarre
(74) *Attorney, Agent, or Firm*—Fleshner & Kim, LLP

(57) ABSTRACT

A method and an apparatus for encoding/decoding RS (Reed-Solomon) code using a binary equivalence method of bit level. The apparatus includes a binary conversion unit for converting non-binary symbols outputted from a source information inputting unit into binary symbols and getting bit level RS code using a binary equivalence of the RS code, an encoding unit for generating row and column vectors using the bit level RS code as a component code, and a decoding unit for decoding the row and column vectors using the binary equivalence of the RS code for the bit level RS sequence.

12 Claims, 5 Drawing Sheets

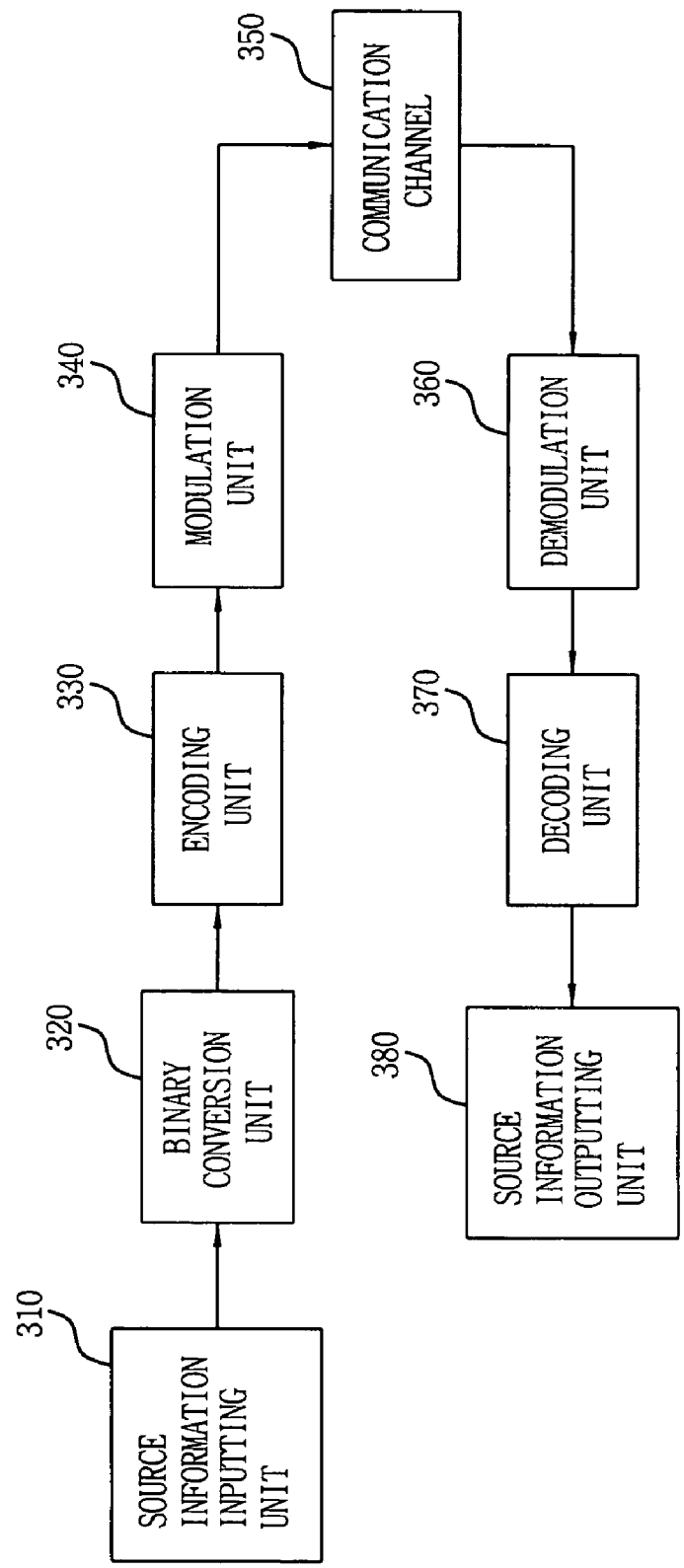

FIG. 4

START
↓
BINARY INFORMATION SEQUENCE *SYSTEMATIC GENERATOR MATRIX — S1
↓ RS CODE BINARY EQUIVALENT
BIT-LEVEL RS CODE BIT-LEVEL RS CODE — S2
↓ COMPONENT CODE
GENERATING ROW AND COLUMN VECTOR — S3

FIG. 5

$$G_b = \left| \begin{array}{ccc} \begin{bmatrix} \alpha^{m-1} & g_{00} \\ \vdots & \vdots \\ \alpha^0 & g_{00} \end{bmatrix} & \cdots & \begin{bmatrix} \alpha^{m-1} & g_{0N-1} \\ \vdots & \vdots \\ \alpha^0 & g_{0N-1} \end{bmatrix} \\ \vdots & \cdots & \vdots \\ \begin{bmatrix} \alpha^{m-1} & g_{k-1,0} \\ \vdots & \vdots \\ \alpha^0 & g_{K-1,0} \end{bmatrix} & \cdots & \begin{bmatrix} \alpha^{m-1} & g_{K-1N-1} \\ \vdots & \vdots \\ \alpha^0 & g_{K-1N-1} \end{bmatrix} \end{array} \right|$$

METHOD AND APPARATUS FOR ENCODING/DECODING REED-SOLOMON CODE IN BIT LEVEL

BACKGROUND OF THE INVENTION

1. Field of the Invention

The present invention relates to an error correction code in a digital communication system, and particularly, to a method and an apparatus for encoding/decoding Reed-Solomon(hereinafter referred to RS) code made by non-binary symbols in bit level.

2. Description of the Background Art

Generally, a product code is a form of a serial concatenation block turbo code, and shows a high trade-off in a performance and in a complexity compared to a turbo code based on a convolution code. Especially, the product code is less complex and has a higher performance than the turbo code based on the convolution code in a high rate system having a high band-width efficiency and in a short block frame for communication devices.

Also, the performance of the product code is decided by the component code, and therefore the RS code having a good characteristics is used for the component code of the product code.

FIG. 1 is a block diagram showing a general digital communication system. As shown therein, the system comprises a source information inputting unit 110 for inputting code information in order to encode source information; an encoding unit 120 for encoding the source information in order to check and correct an error, which may be generated in the source information, on a communication channel based on the inputted code information; a modulating unit 130 for modulating the encoded source information into a signal transmittable on the communication channel; a demodulating unit 150 for demodulating the modulated signal by receiving a transmitted signal from the communication channel 140; a decoding unit 160 for decoding the demodulated signal into the original source information based on the code information; and a source information outputting unit 170 for outputting the source information decoded in the decoding unit 160.

The source information inputting unit 110 is inputted code information such as code length for the symbol, information length, coefficient of information polynomial, and coefficient of generator polynomial.

The encoding unit 120 encodes the symbols based on the code information inputted in the source information inputting unit 110.

The modulating unit 130 modulates the symbols encoded in the encoding unit 120 so as to be transmitted through the communication channels, and after that the modulated symbols are transmitted to destination through the communication channel 140.

The communication channel is made by radio or wire.

The demodulating unit 150 demodulates the transmitted symbols by using a demodulating method corresponding to the modulating method of the modulating unit 130, and after that inputs the demodulated symbols into the decoding unit 160.

The decoding unit 160 decodes the demodulated symbols, and transmits the decoded source information to the source information outputting unit 170.

FIG. 2 is a structure view showing an RS product code according to the conventional art. As shown therein, Section I designates an information part, and Section II and III designate parity parts. Also, Section IV is a parity part for encoding the Section II or Section III making the parity part into the information part.

In the RS product code, respective row and column vectors are (N, K) codewords, and a respective symbol has a $GF(2^m)$ dimension. Also, the size of an interleaver needed to perform encoding/decoding of the RS product code is $K^2$. Therefore, the entire depth of a trellis for SISO (Soft In Soft Out) decoding is N, and a respective node of the trellis has $2^m$ branches.

The SISO decoding method for the RS product code can be divided into two methods.

A first method is a chase algorithm. However, thin algorithm has a problem that the decoder becomes very complex because the number of test patterns which is to be produced is very large for the RS code having a large dimension.

A second method is a SISO decoding method based on a trellis using the MAP (Maximum A posteriori) algorithm, Max-log, SOVA (Soft-Output Viterbi Algorithm) on a trellis of block code.

However, in the above algorithms, the RS code has non-binary characteristics, and the number of branches of a respective trellis node is non-binary. Therefore, the decoding processes of the algorithms in the respective node are more complex than that in the binary branches.

Also, the size of the interleaver is small according to the symbol dimension comparing to the size of the block which performs the decoding. Therefore, it is inefficient to use an iterative decoder in which the performance of the algorithms depends on the size of the interlearver.

SUMMARY OF THE INVENTION

Therefore, an object of the present invention is to provide a decoding algorithm by which branch complexity is reduced comparing to a case of using non-binary symbol, also the size of interleaver is greatly extended in bit level by performing encoding/decoding process by generating trellis of bit level using binary equivalence of RS code.

To achieve the object of the present invention, as embodied and broadly described herein, there is provided a RS code encoding method in a bit level according to the present invention comprising the steps of: generating binary equivalence of RS code by multiplying systematic generator matrix by binary information sequence of the RS code; and generating row and column vector using the binary equivalence of the RS code as a component code.

Also, there is provided a decoding method of the RS code in bit level according to the present invention comprising the steps of: generating binary trellis from a receive signal using binary parity check matrix corresponded to the binary generator matrix of the RS code; and decoding row vector and column vector using the binary trellis, searching extrinsic information of the bit level, and inputting the extrinsic information of the bit level as new decoding information.

In addition, there is provided a encoding apparatus the RS code in the bit level according to the present invention comprising: a source information inputting unit in which source information for encoding is inputted; a binary conversion unit for being inputted non-binary symbols outputted from the source information inputting unit and changing the symbols into binary symbols; a encoding unit for encoding the binary symbols in order to check and correct errors which may be generated by the conversed binary symbols on the communication channels; and a modulating unit modulating the binary symbols encoded in the encoding unit so as to be transmitted through the communication channel.

Also, there is provided a decoding apparatus for RS code on bit level according to the present invention comprising: a demodulating unit for demodulating the binary symbols of the RS code transmitted through the communication channel; a decoding unit for decoding row vectors and column vectors of the demodulated binary symbols repeatedly using the binary equivalence of the RS code; and a source information outputting unit for outputting the decoded binary symbols as data stream.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 3 is a block diagram showing a digital communication system according to the present invention;

FIG. 4 is a flow chart of calculating binary equivalence generator matrix of RS code according to the present invention;

FIG. 5 is a binary matrix made by using the binary equivalence of the RS product code according to the present invention;

DETAILED DESCRIPTION OF THE PREFERRED EMBODIMENTS

Figure 1:
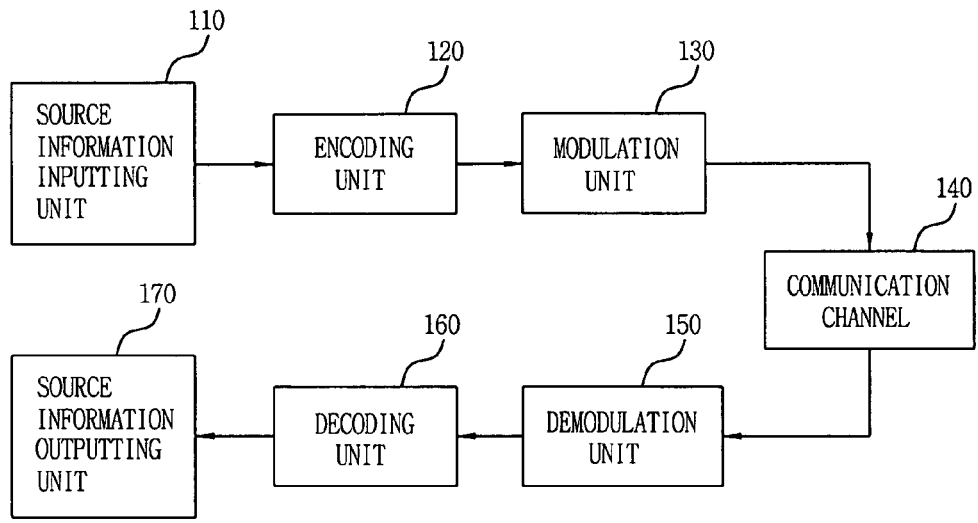
FIG. 1 is a block diagram showing a digital communication system according to the conventional art.
Figure 2:
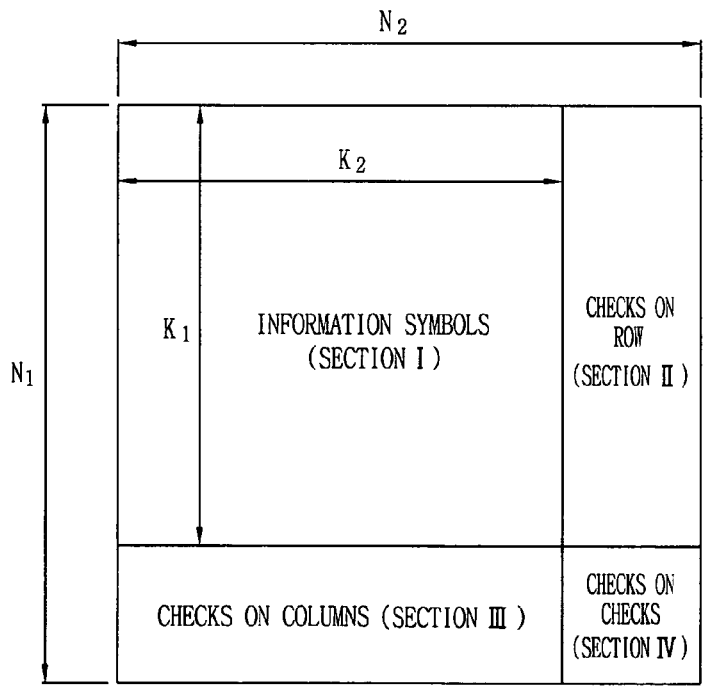
FIG. 2 is a structure view showing encoding/decoding of a product code according to the conventional art.

Reference will now be made in detail to the preferred embodiments of the present invention, examples of which are illustrated in the accompanying drawings.

FIG. 3 is a block diagram showing a digital communication system according to the present invention. As shown therein, the digital communication system comprises: a source information inputting unit 310 inputting code information in order to encode source information; a binary conversion unit 320 for converting non-binary symbols outputted from the source information inputting unit 310 into binary symbols; an encoding unit 330 for encoding the source information in order to check and correct errors which may be generated in the source information on a communication channel; a modulating unit 340 for modulating the encoded source information into signals which are transmittable on the communication channel; a demodulating unit 360 for receiving the signals from the communication channel and demodulating the modulated signals; a decoding unit 370 for decoding the demodulated signals into the original source information based on the code information; and a source information outputting unit 380 for outputting the source information decoded in the decoding unit 370.

The source information inputting unit 310 is inputted with code information such as a code length for the symbols, information length, coefficient of the information polynomial, and coefficient of generator polynomial.

The binary conversion unit 320 changes the non-binary symbols outputted from the source information inputting unit 310 into the binary symbols.

The encoding unit 330 encodes the source information in order to check and correct errors which may be generated in the binary symbols when the binary symbols are transmitted through the communication channel.

The modulating unit 340 modulates the encoded symbols in the encoding unit 330 using methods of BPSK(Binary Phase Shift Keying), DPSK(Differential Phase Shift Keying), and QAM(Quadrature Amplitude Modulation) so that the symbols can be transmitted through the communication channel 350, and after that transmits the modulated symbols to the destinations through the communication channel 350.

The demodulating unit 360 demodulates the transmitted symbols from the modulating unit 340 using methods which are corresponded to the modulating methods, and after that inputs the demodulated symbols into the decoding unit 370.

The decoding unit 370 decodes the demodulated symbol, and transmits the decoded source information to the source information outputting unit 380.

FIG. 4 is a flow chart showing processes of calculating a binary equivalence generator matrix of the RS code according to the present invention.

FIG. 5 is a binary matrix made by using the binary equivalence of the RS product code according to the present invention.

Figures 6, 7:
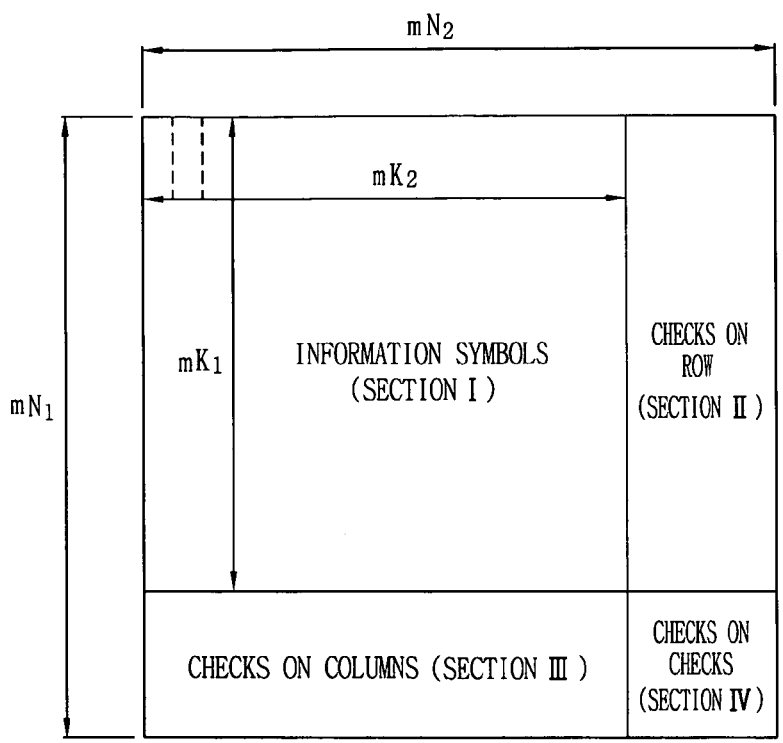
FIG. 6 is a structure view showing the RS product code using a component code comprising the binary equivalence of the RS code according to the present invention.
FIG. 7 is an exemplary view of (7, 5) RS code in GF($2^3$)

FIG. 6 is a structure view showing the RS product code made by using a component code comprising the binary equivalence of the RS code according to the present invention. As shown therein, Section I designates information part, and Section II and III designate parity parts. Also, Section IV is a parity part for encoding the Section II or Section III making the parity part into the information part.

The encoding processes of the RS code will be described as follows with reference to FIGS. 4, 5, and 6.

A generator matrix G for (N, K) RS code of code length N and of information length K having a symbol $\alpha^l$ of a certain GF($2^m$) is expresses as following polynomial by interpreting linear combination of respective symbol.

$$\alpha^l = \sum_{j=0}^{m-1} \alpha_j \alpha^j \text{ for } \alpha_j \in GF(2) \text{ and } \alpha^j \in GF(2^m) \qquad \text{Equation (1)}$$

Therefore, multiple of any symbols A and B is expressed as follows.

$$A \cdot B = \sum_{j=0}^{m-1} \alpha_j \alpha^j \cdot \sum_{k=1}^{m-1} b_k \alpha^k = \sum_{j=0}^{m-1}\sum_{k=0}^{m-1} \alpha_j b_k \alpha^{j+k} \qquad \text{Equation (2)}$$

The linear combination of Equation (2) can be expressed as following matrix.

$$|\alpha_{m-1}, \alpha_{m-2}, \ldots, \alpha_0| \cdot \begin{vmatrix} b_{m-1}\alpha^{2m-2} & \cdots & b_0\alpha^{m-1} \\ b_{m-1}\alpha^{2m-3} & \cdots & b_0\alpha^{m-2} \\ & \cdots & \\ b_{m-1}\alpha^m & \cdots & b_0\alpha \\ b_{m-1}\alpha^{m-1} & \cdots & b_0\alpha^0 \end{vmatrix} = \quad \text{Equation (3)}$$

$$\begin{vmatrix} \alpha_{m-1}b_{m-1}\alpha^{2m-2} & \cdots & \alpha_{m-1}b_0\alpha^{m-1} \\ \alpha_{m-2}b_{m-1}\alpha^{2m-3} & \cdots & \alpha_{m-2}b_0\alpha^{m-2} \\ & \cdots & \\ \alpha_1 b_{m-1}\alpha^m & \cdots & \alpha_1 b_0\alpha \\ \alpha_0 b_{m-1}\alpha^{m-1} & \cdots & \alpha_0 b_0\alpha^0 \end{vmatrix}$$

Respective column vectors in the right matrix of Equation (3) are made such that the symbol vectors having symbol B are multiplied by $\alpha^0 \sim \alpha^{m-1}$ in order, after that, binary elements having symbol A are multiplied with the results. That is, a binary equivalence generator matrix for a generator matrix having a certain $GF(2^m)$ symbol is made by multiplying $\alpha^0, \ldots, \alpha^{m-1}$ in order to respective symbols of 'G', and when the respective symbols of the new matrix are calculated as a binary form as in Equation (1), then it becomes the binary equivalence of the RS code (step SI).

At that time, the generated binary codeword has the same code characteristics in the original RS code and in symbol weight distribution even if the encoding processes are made at bit level.

Therefore, through Equations (1), (2), and (3), the number of rows is increased as many as the number of multiplying original row numbers by m, and the binary generator matrix is made by expressing respective symbols constituting the matrix on a polynomial basis. In the binary matrix, the components are 0 or 1 unlike in the original matrix, and the original non-binary matrix is converted into the binary matrix having rows and columns which are m times of the original rows and columns. In addition, the bit level RS code is generated by using the binary matrix (step S2 in FIG. 4).

At that time, the generated binary codeword has the same code characteristics in the original RS code and in symbol weight distribution even if the encoding processes are made at bit level.

Also, as shown in FIG. 6, the encoding unit 330 has a similar structure as that of the conventional encoding unit 120, however, the components vectors of the respective rows and columns are made in binary level, and therefore an interleaver of binary level is formed. Therefore, the size of the interleaver is proportional to the square of used binary symbol dimension. For example, for a (N, K) RS code having respective symbols of $GF(2^m)$ dimension, the size of interleaver enlarges to mK×mK from K×K of conventional (step S3 in FIG. 4).

Therefore, the size of interleaver is $m^2K^2$, the entire depth of trellis for SISO decoding of respective vectors is in mN, and the number of branches in a respective node is two.

Therefore, SISO decoding in a bit level trellis structure can reduce the complexity of branches, and is useful in a decoder in which branches of a trellis is more complex than the depth of the trellis.

FIG. 7 is an exemplary view showing (7, 5) RS code in $GF(2^3)$. As shown therein, a GF(2) binary generator matrix is made from the non-binary generator matrix on the left side. Respective non-binary values constituting the left matrix are extended to matrix of 3×3 bit through Equations (2) and (3).

Figure 8:
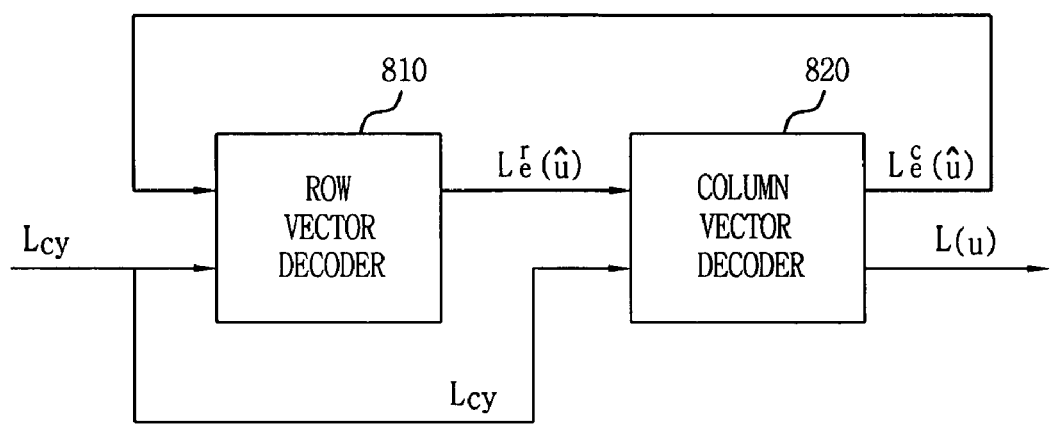
FIG. 8 is a block diagram showing a decoding unit according to the present invention.

FIG. 8 is a block diagram showing the decoding unit according to the present invention. As shown therein, the decoding unit comprises a column vector decoder 810 calculating sequence ($L_c$y) received from the communication channel and previous decoding information ($L_u^c(\hat{u})$) and outputting column vector ($L^r(\hat{u})$); and a row vector decoder 820 outputting decoding vector ($L(\hat{u})$) by being inputted the column vector ($L^r(\hat{u})$), and inputting the row vector ($L_u^c(\hat{u})$) into the column vector decoder 810 by being inputted the sequence ($L_c$y) transmitted from the communication channel 350.

The column vector decoder 810 outputs column Vector ($L(\hat{u})$) by calculating the sequence ($L_c$y) transmitted from the communication channel 350 and the previous row vector ($L_u^c(\hat{u})$), and the row vector decoder 820 outputs decoding vector ($L(\hat{u})$) by being inputted the column vector ($L^r(\hat{u})$) outputted from the column vector decoder and outputs the row vector ($L_u^c(\hat{u})$) to the column vector decoder 810 by being inputted the sequence ($L_c$y) transmitted from the communication channel 350, whereby the decoding unit 370 feedbacks the bit extrinsic information outputted from the SISO decoder.

That is, the decoding unit 370 generates a binary generator matrix of RS code on being inputted the RS sequence outputted from the demodulating unit 360, and generates a binary trellis using the binary parity check matrix corresponding to the binary generator matrix of the RS code.

Also, the decoding unit 370 decodes the column vector and the row vector in the binary trellis in order and inputs the extrinsic information of bit level as a new information in the repeated decoding processes. In addition, through the repeated decoding processes, the row vectors and the column vectors are calculated as shown in FIG. 8.

The decoding processes of the row and column vectors use conventional method using parity check matrix as a trellis generation method for the block code. In the structure above, the RS code having high decoding rate and systematic form is able to get the parity check matrix from the generator matrix, and the number of trellis states is smaller than in low decoding rate. The above processes are similar to the conventional art, however the trellis of binary level is applied to the row and column vectors of binary level and the decoder of binary level is used, whereby the extrinsic information of binary level is generated according to the present invention.

As described above, the encoding/decoding process is performed by generating the trellis of bit level using the binary equivalence according to the present invention, whereby the branch complexity is reduced than in case of using the non-binary symbols. Also, the size of the interleaver which is an important part of repeated code is greatly enlarged in bit level.

Also, the present invention has higher performance than the RS product code of non-binary in case that the present invention is applied to the communication system having a short block.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such meets and bounds are therefore intended to be embraced by the appended claims.

What is claimed is:

1. An encoding method of an RS (Reed-Solomon) code in bit level, the method being performed in an encoding apparatus and comprising:
   generating a binary equivalence matrix of the RS code by multiplying a non-binary systematic generator matrix and a binary information sequence of the RS code such that the generated binary equivalence matrix includes row and columns which are m times rows and columns of the non-binary matrix, where symbols of the non-binary matrix have a $GF(2^m)$ dimension; and
   generating row and column vectors using the binary equivalence matrix of the RS code as a component code.

2. A decoding method of an RS (Reed-Solomon) code in bit level, the method being performed in a decoding apparatus and comprising:
   generating a binary trellis using a binary parity check matrix corresponding to a binary generator matrix of the RS code from a received signal; and
   performing repeatedly processes of decoding row and column vectors using the binary trellis and of getting extrinsic information of bit level and inputting the extrinsic information of bit level as a new decoding information,
   wherein the binary generator matrix of the RS code is converted from a non-binary matrix originally representing the RS code and includes rows and columns which are m times rows and columns of the non-binary matrix, where symbols of the non-binary matrix have a $GF(2^m)$ dimension.

3. An encoding apparatus of an RS (Reed-Solomon) code in bit level comprising:
   a source information inputting unit configured to receive source information for encoding;
   a binary conversion unit configured to convert non-binary symbols outputted from the source information inputting unit into binary symbols;
   an encoding unit configured to encode the binary symbols to check and correct errors which may be generated by the binary symbols on a communication channel; and
   a modulating unit configured to modulate the binary symbols encoded in the encoding unit so as to transmit the symbols through the communication channel,
   wherein the binary conversion unit generates a binary equivalence of the RS code by multiplying a binary information sequence and a non-binary systematic generator matrix such that the generated binary equivalence matrix includes row and columns which are m times rows and columns of the non-binary matrix, xvhere symbols of the non-binary matrix have a $GF(2^m)$ dimension, and then generates a bit level RS code using the binary equivalence matrix.

4. The apparatus of claim 3, wherein the encoding unit generates row and column vectors using the bit level RS code as a component code.

5. A decoding apparatus of an RS (Reed-Solomon) code in bit level comprising:
   a demodulating unit configured to demodulate binary symbols of the RS code transmitted from a communication channel;
   a decoding unit configured to repeatedly decode row and column vectors of the binary symbols using a binary equivalence matrix of the RS code; and
   a source information outputting unit configured to output the decoded binary symbols as a data stream,
   wherein the binary equivalence matrix of the RS code is converted from a non-binary matrix originally representing the RS code and includes rows and columns which are m times rows and columns of the non-binary matrix, where symbols of the non-binary matrix have a $GF(2^m)$ dimension.

6. The apparatus of claim 5, wherein the decoding unit comprises:
   a column vector decoder configured to generate a column vector by calculating the sequence of the bit level RS code and nexv decoding information transmitted from the demodulating unit; and
   a row vector decoder configured to generate a row vector by being inputted the column vector transmitted from the column vector decoder, and to feedback new decoding information to the column vector decoder.

7. A storage medium with computer programming instructions contained therein, the instructions when executed causing a processing device to perform
   a first computer code transforming a non-binary matrix representation of a Reed-Solomon (RS) code including non-binary symbols into a binary equivalence matrix including only binary symbols; and
   a second computer code generating row and column vectors using the binary equivalence matrix,
   wherein each non-binary symbol is transformed into an m×m matrix, where symbols of the non-binary matrix have $GF(2^m)$ dimension, and
   wherein the binary equivalence matrix includes row and columns which are m times row and columns of the non-binary matrix.

8. The computer program product of claim 7, further comprising:
   a third computer code configured to encode the binary symbols to check and correct errors which may be generated by the binary symbols on a communication channel; and
   a fourth computer code configured to modulate the encoded binary symbols so as to transmit the symbols through the communication channel.

9. The computer program product of claim 8, further comprising:
   a fifth computer code configured to demodulate the binary symbols of the RS code transmitted from the communication channel;
   a sixth computer code configured to repeatedly decode row and column vectors of the binary symbols using the binary equivalence matrix of the RS code; and
   a seventh computer code configured to output the decoded binary symbols as a data stream.

10. An apparatus for processing a Reed-Solomon (RS) code, comprising:
    a converting unit configured to transform a non-binary matrix representation of the RS code including non-binary symbols into a binary equivalence matrix including only binary symbols; and
    an encoding unit configured to encode row and column vectors using the binary equivalence matrix,
    wherein the converting unit transforms each non-binary symbol into an m×m matrix, where symbols of the non-binary matrix have a $GF(2^m)$ dimension, and wherein the binary equivalence matrix includes row and columns which are m times row and columns of the non-binary matrix.

11. The apparatus of claim 10, further comprising:
the encoding unit configured to encode the binary symbols to check and correct errors which may be generated by the binary symbols on a communication channel; and
a modulating unit configured to modulate the encoded binary symbols so as to transmit the symbols through the communication channel.

12. The apparatus of claim 11, further comprising:
a demodulating unit configured to demodulate binary symbols of the RS code transmitted from the communication channel;
a decoding unit configured to repeatedly decode row and column vectors of the binary symbols using the binary equivalence matrix of the RS code; and an outputting unit configured to output the decoded binary symbols as a data stream.

\* \* \* \* \*